US012444657B2

(12) United States Patent
Liu et al.

(10) Patent No.: US 12,444,657 B2
(45) Date of Patent: Oct. 14, 2025

(54) WAFER PROCESSING METHOD

(71) Applicant: TAIWAN SEMICONDUCTOR MANUFACTURING CO., LTD., Hsinchu (TW)

(72) Inventors: Yan-Hong Liu, Hsinchu County (TW); Daniel M. Y. Yang, Hsinchu (TW); Che-Fu Chen, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/356,084

(22) Filed: Jul. 20, 2023

(65) Prior Publication Data
US 2023/0360977 A1 Nov. 9, 2023

Related U.S. Application Data

(62) Division of application No. 16/444,792, filed on Jun. 18, 2019, now Pat. No. 11,756,840.

(60) Provisional application No. 62/733,651, filed on Sep. 20, 2018.

(51) Int. Cl.
G01N 21/55 (2014.01)
H01L 21/3213 (2006.01)
H01L 21/66 (2006.01)
H01L 21/67 (2006.01)
H01L 21/687 (2006.01)
H05K 3/06 (2006.01)

(52) U.S. Cl.
CPC ............ H01L 22/12 (2013.01); G01N 21/55 (2013.01); H01L 21/32137 (2013.01); H01L 21/67253 (2013.01); H01L 21/68707 (2013.01); H05K 3/068 (2013.01)

(58) Field of Classification Search
None
See application file for complete search history.

(56) References Cited

U.S. PATENT DOCUMENTS

| 5,348,609 | A | 9/1994 | Russell |
| 5,963,329 | A | 10/1999 | Conrad et al. |
| 6,068,704 | A | 5/2000 | Saeki |
| 6,156,124 | A | 12/2000 | Tobin |
| 6,530,993 | B2 * | 3/2003 | Hwang ............ H01L 21/67167 156/345.31 |
| 6,633,170 | B2 * | 10/2003 | Kong ................ G01N 22/00 324/637 |

(Continued)

FOREIGN PATENT DOCUMENTS

| CN | 1471726 A | 1/2004 |
| CN | 1711632 A | 12/2005 |

(Continued)

Primary Examiner — Sylvia MacArthur
(74) Attorney, Agent, or Firm — Maschoff Brennan

(57) ABSTRACT

A method includes: transferring a wafer from a factory interface through a load lock chamber to a buffer chamber; transferring the wafer from the buffer chamber to a process chamber; etching the wafer in the process chamber, to remove a material of the wafer; and after the wafer is etched, performing reflectance measurements to the wafer in the factory interface, the load lock chamber, the buffer chamber, or combination thereof, to identify if the material of the wafer is removed entirely according to a reflectance of the wafer.

20 Claims, 6 Drawing Sheets

(56) References Cited

U.S. PATENT DOCUMENTS

| | | |
|---|---|---|
| 6,841,485 B1 | 1/2005 | Matsumoto |
| 7,306,696 B2 | 12/2007 | Lian |
| 7,880,155 B2 | 2/2011 | Krupysheb |
| 7,989,348 B2 | 8/2011 | Yamaguchi |
| 8,543,557 B2 * | 9/2013 | Aikens ................. G01N 21/956 |
| | | 707/700 |
| 9,050,635 B2 | 6/2015 | Mitsuyoshi |
| 9,457,476 B2 | 10/2016 | Chen |
| 10,197,908 B2 * | 2/2019 | Sriraman ................... G03F 1/70 |
| 2001/0016363 A1 * | 8/2001 | Yano ....................... H01L 22/26 |
| | | 118/712 |
| 2002/0013007 A1 | 1/2002 | Hasegawa et al. |
| 2002/0068992 A1 | 6/2002 | Hine |
| 2003/0000922 A1 * | 1/2003 | Subramanian .... H01L 21/67253 |
| | | 216/60 |
| 2003/0045100 A1 | 3/2003 | Saka |
| 2003/0131458 A1 | 7/2003 | Wang |
| 2003/0165755 A1 | 9/2003 | Mui et al. |
| 2003/0180973 A1 | 9/2003 | Lehman |
| 2003/0230384 A1 | 12/2003 | Su |
| 2004/0029333 A1 | 2/2004 | Matsukawa |
| 2004/0087152 A1 | 5/2004 | Lian et al. |
| 2004/0092047 A1 | 5/2004 | Lymberopoulos et al. |
| 2005/0006230 A1 * | 1/2005 | Narushima ....... H01L 21/67167 |
| | | 118/728 |
| 2005/0199341 A1 | 9/2005 | Delp |
| 2005/0222781 A1 * | 10/2005 | Yue ....................... G05B 13/048 |
| | | 702/30 |
| 2005/0252884 A1 | 11/2005 | Lam |
| 2006/0167583 A1 | 7/2006 | Sundar |
| 2007/0075037 A1 | 4/2007 | Chang et al. |
| 2007/0282480 A1 * | 12/2007 | Pannese ........... H01L 21/67745 |
| | | 700/245 |
| 2013/0183831 A1 * | 7/2013 | Yu ..................... H01L 21/67288 |
| | | 118/724 |
| 2013/0334172 A1 | 12/2013 | Matsumoto |
| 2014/0242879 A1 | 8/2014 | David |
| 2015/0004721 A1 | 1/2015 | Akimoto |
| 2016/0077025 A1 | 3/2016 | Zhang et al. |
| 2017/0323806 A1 | 11/2017 | Cheung et al. |
| 2018/0108578 A1 | 4/2018 | Pandev et al. |
| 2019/0047109 A1 | 2/2019 | Zhou |
| 2020/0098648 A1 | 3/2020 | Liu |
| 2023/0360977 A1 * | 11/2023 | Liu ................... H01L 21/68707 |

FOREIGN PATENT DOCUMENTS

| | | |
|---|---|---|
| TW | 200305250 A | 10/2003 |
| TW | 200715087 A | 4/2007 |
| TW | 201324659 A | 6/2013 |

* cited by examiner

WAFER PROCESSING METHOD

PRIORITY CLAIM AND CROSS-REFERENCE

The present application is a divisional application of U.S. application Ser. No. 16/444,792, filed on Jun. 18, 2019, which claims priority to U.S. Provisional Application Ser. No. 62/733,651, filed Sep. 20, 2018, which is herein incorporated by reference.

BACKGROUND

A measurement or test of a conventional etching process is performed after the following processes are done. The status of the etching process is able to be known after the measurement or the test is done. Thus, an off-line measurement is performed to known the status of the etching process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
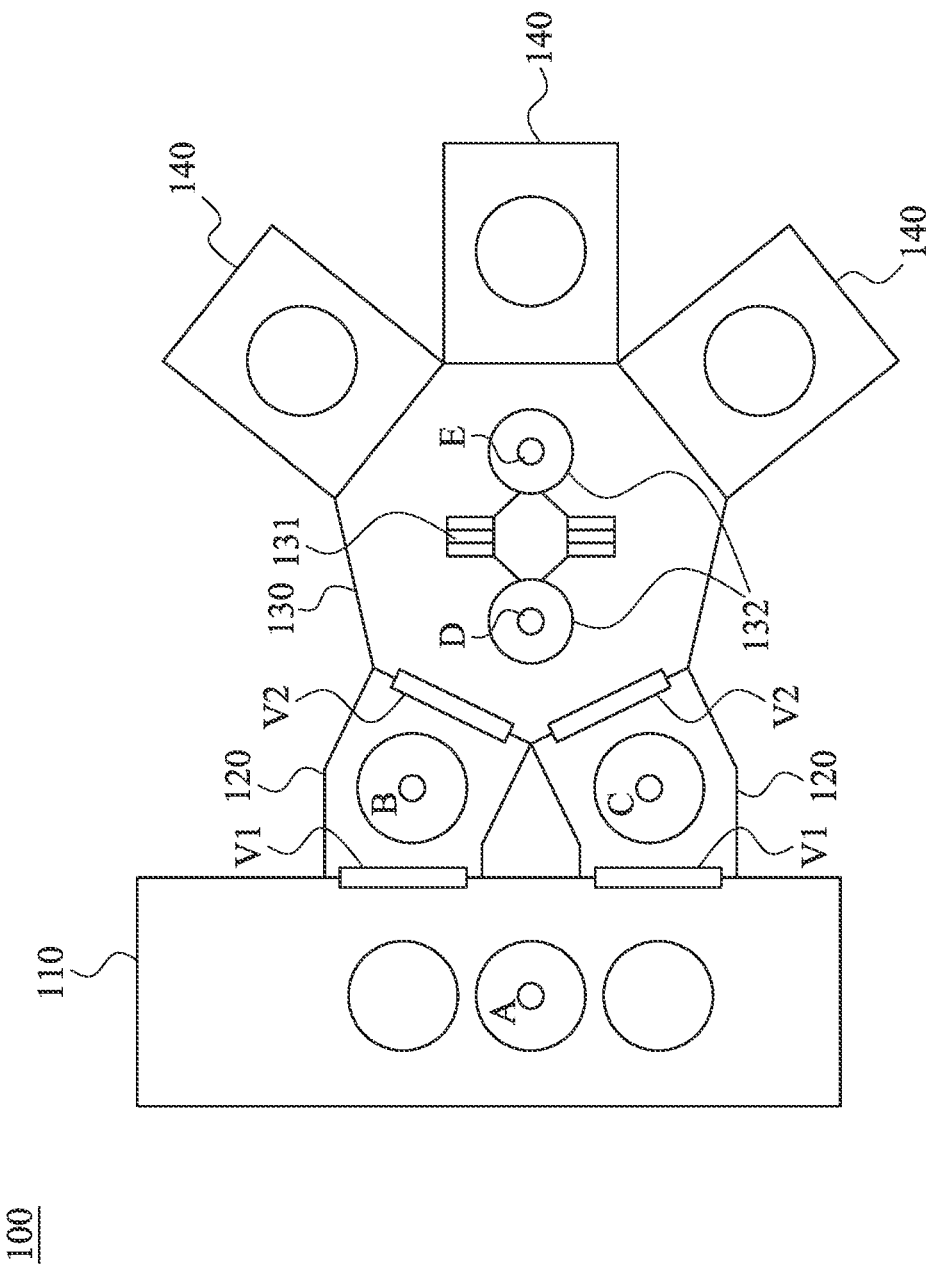
FIG. 1 is a top view illustrating a multi-chamber system, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In this document, the term "coupled" may also be termed as "electrically coupled", and the term "connected" may be termed as "electrically connected". "Coupled" and "connected" may also be used to indicate that two or more elements cooperate or interact with each other.

Reference is made to FIG. 1. FIG. 1 is a top view illustrating a multi-chamber system 100, according to some embodiments of the present disclosure. The multi-chamber system 100 includes a factory interface 110, at least one load lock chamber 120, a buffer chamber 130, and several process chambers 140. For illustration in FIG. 1, the factory interface 110 is coupled to the at least one load lock chamber 120. The at least one load lock chamber 120 is coupled to the buffer chamber 130. The process chambers 140 are disposed around and coupled to the buffer chamber 130. In some embodiments, the at least one load lock chamber 120, the buffer chamber 130, the process chambers 140 are also each referred to as a process tool. In further embodiments, the process tool implementing the process chamber 140 is configured as an etching tool.

In some embodiments, the factory interface 110 is configured to load and transfer wafers to a manufacturing chamber. The factory interface 110 is also coupled to the manufacturing chamber, for example, the load lock chambers 120. In some embodiments, the factory interface 110 further includes a robot (not shown) configured to carry wafers and to transfer the wafers to a predetermined position. In some embodiments, the factory interface 110 is operated under a first environment, for example, the factory interface 110 is kept at room temperature and room pressure, in which the first environment is referred to as an atmosphere transfer module. It is noted that many possible variations and options of the first environment of the factory interface 110 are within the contemplated scope of the present disclosure, for example, in some other embodiments, the factory interface 110 is operated under a high temperature (e.g., a temperature higher than a room temperature) and low pressure (e.g., a pressure lower than 1 atmosphere pressure) environment.

In some embodiments, the at least one load lock chamber 120 is configured to receive and transfer the wafer from the factory interface 110 and the buffer chamber 130. For illustration of FIG. 1, there are two load lock chambers 120. Each one of the load lock chambers 120 includes a valve V1 and a valve V2. The valve V1 and the valve V2 are configured to isolate the environment of the corresponding load lock chamber 120 from the adjacent device when the valves are closed, and configured to equalize the environment of the corresponding load lock chamber 120 and the adjacent device when the valves are open. In some embodiments, each one of the load lock chambers 120 further includes a vacuum pump (not shown) configured to vacuum the load lock chamber 120.

The number of the load lock chambers 120 in FIG. 1 is given for illustrative purposes. Various numbers of the load lock chambers 120 are within the contemplated scope of the present disclosure. For simplicity of illustration, operations of one of the load lock chambers 120 and configurations associated one of the load lock chambers 120 are discussed below and given for illustrative purposes.

In some embodiments, when the load lock chamber 120 is ready for receiving the wafer from the factory interface 110, the valve V1 is open and allows the robot of the factory interface 110 to pass through and place the wafer in position. The valve V2 is closed, and the environment of the load lock chamber 120 has the same environment as the factory interface 110, i.e. the first environment. After the valve V1 is closed, the load lock chamber 120 is vacuumed to, for example, a low pressure such as about 200 m-torrs. Other pressures may also be used, for example, less than 10 m-torrs, as determined by the type of vacuum pump used for evacuation of the load lock chambers 120.

In some embodiments, when the load lock chamber 120 is ready for receiving the wafer from the buffer chamber 130, the valve V2 is open and allows the buffer chamber 130 to pass through and place the wafer in position. The valve V1 is closed, and the environment of the load lock chamber 120 has the same environment as the buffer chamber 130, i.e. a second environment (will be discussed below).

In some embodiments, the buffer chamber 130 includes a robot 131 which has at least one robot blade 132. The robot 131 is movable in three-axes including, for example, x, y, z axes in Cartesian coordination system, and rotatable at any angles. For illustration in FIG. 1, the robot 131 is disposed at the center of the buffer chamber 130. The robot 131 has two robot blades 132, and the robot blades 132 are each attached to the opposite side of the robot 131. In some embodiments, the robot blade 132 is adapted for handling and transferring the wafer to and from various positions, for example, the load lock chamber 120.

The buffer chamber 130 is coupled to a vacuum system (not shown) so as to provide a reduced atmosphere condition. In some embodiments, the buffer chamber is operated under a high vacuum environment, i.e. the second environment, in order to avoid particle contamination. In some embodiments, the second environment has a pressure lower than the pressure in the first environment, and the temperature in the second environment is approximately equal to the temperature in the first environment. In some other embodiments, the temperature in the second environment is higher than the temperature in the first environment. In alternative embodiments, the temperature in the second environment is lower than the temperature in the first environment.

In some embodiments, prior to vacuuming the load lock chamber 120, the buffer chamber 130 is already maintained as the second environment so that the environment of the load lock chamber 120 and the buffer chamber 130 are closer.

In some embodiments, two pumping steps are utilized to change an environment from the first environment to the second environment. For example, according to the configuration of FIG. 1, the vacuum pump in the load lock chamber 120 and the vacuum system coupled to the buffer chamber 130 are used in these two pumping steps.

In some embodiments, the process chambers 140 are plasma process chambers, deposition chambers, diffusion chambers, or the combination thereof. The plasma process chamber is configured to operate a dry etching process including, for example, a reactive ion etching (RIE) process. The plasma process chamber provides reactive ion gas so as to react with material layers or the wafer. The deposition chamber provides a vapor phase of a material including any operations such as, but not limited to, chemical vapor deposition (CVD) and physical vapor deposition (PVD). A material layer can be deposited on the wafer in the deposition chamber. The diffusion chamber provides a thermal process such as a rapid thermal annealing or a laser annealing. A deposited layer can be annealed in the diffusion chamber. The amount and the configuration of the process chambers 140 shown in FIG. 1 are given for the illustrative purposes. Various amounts and the configuration of the process chambers 140 are within the contemplated scope of the present disclosure.

At least one of the process chambers 140 in the multi-chamber system 100 is plasma process chamber configured for performing an etching process. For illustration in FIG. 1, the plasma process chamber is connected with the buffer chamber 130. In some embodiments, the wafer is transferred from the buffer chamber 130 to the plasma process chamber by the robot blade 132. After the etching process in the plasma process chamber, the wafer is returned to the buffer chamber 130 by the robot blade 132.

Figure 2:
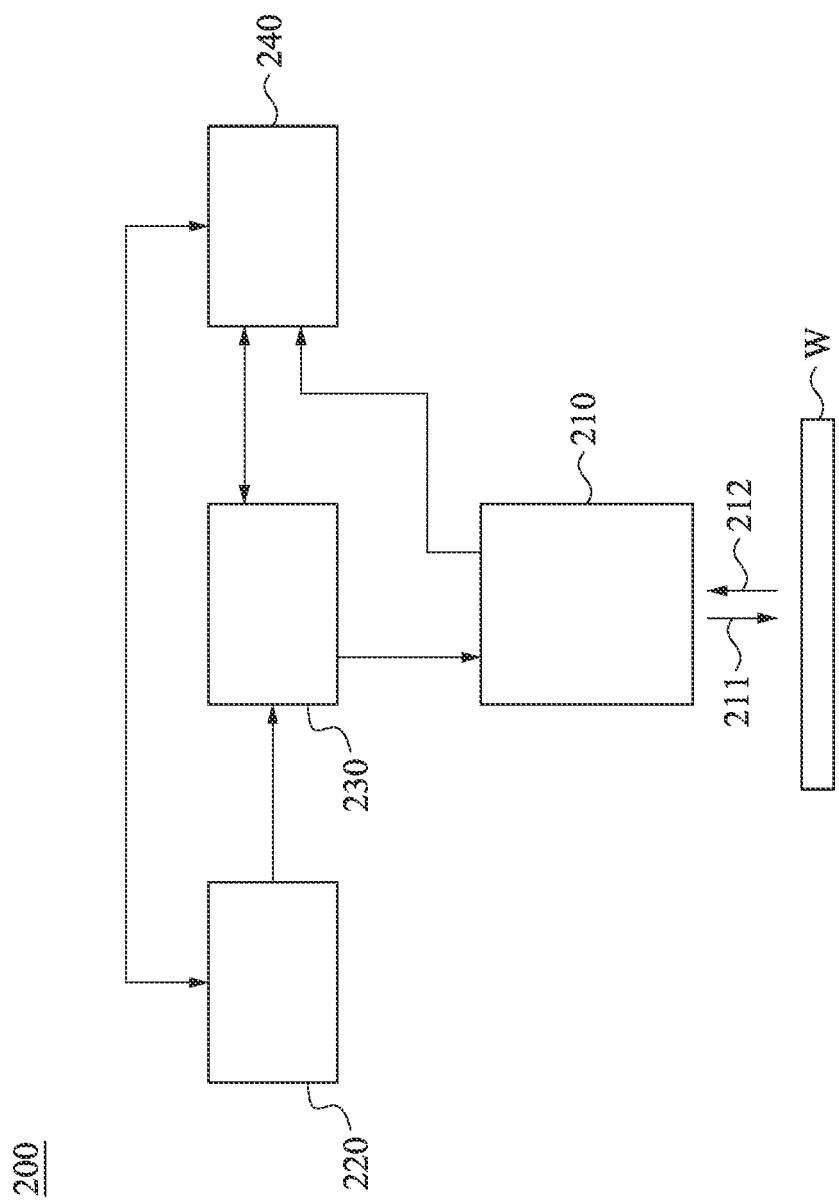
FIG. 2 is a measuring system 200 including at least one device configured in the multi-chamber system 100 of FIG. 1, according to some embodiments of the present disclosure.

The multi-chamber system 100 further includes at least one measuring device (e.g., an optical reflectometer 210 as shown in FIG. 2) equipped in the factory interface 110, the load lock chambers 120, the buffer chamber 130, or the combination thereof. The configuration of the above measuring device will be discussed below with reference to FIG. 2.

In some embodiments, the measuring device is configured to measure the optical reflectance from the wafer. After the etching process for the wafer is done, the measuring device measures the optical reflectance from the wafer. In some embodiments, the measuring device is equipped in the buffer chamber 130 and measures the optical reflectance from the wafer in the buffer chamber 130 after the wafer is processed and transferred from the plasms process chamber. In some other embodiments, the measuring device is equipped in the load lock chamber 120 and measures the optical reflectance from the wafer in the load lock chamber 120 after the wafer is transferred from the buffer chamber 130. In alternative embodiments, the measuring device is equipped in the factory interface 110 and measures the optical reflectance from the wafer in the factory interface 110 after the wafer is transferred from the load lock chamber 120.

For illustration in FIG. 1, the measuring device is able to be equipped in position A which corresponds to the factory interface 110, positions B-C which correspond to the load lock chambers 120, or positions D-E which correspond to the robot blade 132 of the robot 131 of the buffer chamber 130. The positions A-E in FIG. 1 are given for illustrative purposes. Various positions are within the contemplated scope of the present disclosure.

In some embodiments, the measuring device is configured to measure multi-wavelength reflectance from the wafer. In some embodiments, the measuring device is configured to distinguish target materials on the wafer so as to identify what material is disposed on the wafer. Alternatively stated, the measuring device is configured to identify a status of the wafer after the etching process is done.

In some embodiments, the measuring device is configured to perform real-time measurements of reflectance from the wafer. The measuring device measures the reflectance from the wafer immediately after the etching process is done. Alternatively stated, the reflectance measurement is the immediately next process of the etching process. There is no other process performed between the etching process and the reflectance measurement except transferring the wafer.

The configuration of the multi-chamber system 100 is given for illustrative purposes. Various configurations of the multi-chamber system 100 are with the contemplated scope of the present disclosure.

Reference is made to FIG. 2. FIG. 2 is a measuring system 200 including at least one device configured in the multi-chamber system 100 of FIG. 1, according to some embodiments of the present disclosure. The measuring system 200 includes an optical reflectometer 210 used as the measuring device as discussed above, a process module 220, a data collection control unit 230, and a processor 240. For illustration in FIG. 2, the data collection control unit 230 is coupled to the optical reflectometer 210. The process module 220 is coupled to the data collection control unit 230. The optical reflectometer 210, the process module 220, and the data collection control unit 230 are coupled to the processor 240. In some embodiments, the measuring system 200 does not include the processor 240, and the processor 240 is an external device coupled to and cooperating with the measuring system 200.

During the measurement, the optical reflectometer 210 is positioned above the wafer W. The optical reflectometer 210 is configured to make real-time measurements of reflectance from the wafer W. The optical reflectometer 210 includes a light source (not shown) for generating a light beam 211. In some embodiments, the optical reflectometer 210 is a broadband light source. The operating wavelength band of the light source is selected to be in the region where there is sensitivity to the material disposed on the wafer W (for example, silver, aluminum, gold, copper, platinum, and rhodium). For illustration, when the light source has a broader wavelength range, the material disposed on the wafer W is able to reflect the light of a corresponding wavelength range. Furthermore, the reflectance of the material varies corresponding to the wavelength range of the light source. Accordingly, compared to a conventional approach, when the light source emits light having a broader wavelength range, the light reflected by the material disposed on the wafer W is able to contain more information about the reflectance, and the optical reflectometer 210 is able to measure the reflectance based on more information contained by the reflected light. Based on the above, the optical reflectometer 210 is more sensitive with the light of the broader wavelength range. Accordingly, a broader wavelength range of light source is more useful. Alternatively stated, a measurement with a broader wavelength range of the light source has higher sensitivity. In some embodiments, the wavelength range of the light source is about 280 nm (nanometers: nm) to about 1000 nm. The materials disposed on the wafer W and the wavelength range of the light source are given for the explanation purposes. Various materials on the wafer and wavelength range are within the contemplated scope of the present disclosure.

In some embodiments, the light source in the optical reflectometer 210 is configured to generate the light beam 211 and direct the light beam 211 to strike the wafer W at normal incidence, in which a reflected light beam 212 is generated at normal incidence with respect with the wafer W. The light beam 211 striking the wafer W at normal incidence is given for illustrative purposes. Various incident angles of the light beam 211 striking the wafer W are within the contemplated scope of the present disclosure. For example, in various embodiments, the optical reflectometer 210 generates the light beam 211 striking the wafer W at various incidences, and cooperates with additional sensors (not shown) to receive the light reflected from the wafer W.

In some embodiments, the optical reflectometer 210 includes a system of optical elements (not shown) for focusing the light beam 211 on the wafer W. Focusing the light beam 211 is related to the geometry between the optical reflectometer 210 and the wafer W.

Although FIG. 2 does not show any pattern disposed on the wafer W, it is obvious to one of skill in the art that the wafer W has a pattern and/or structure disposed thereon after the etching process. In some embodiments, the optical reflectometer 210 is configured to align the light beam 211 generated from the light source with the target material in the pattern and/or structure disposed on the wafer W.

In some embodiments, the optical reflectometer 210 further includes a spectrometer (not shown) for detecting and analyzing the spectrum of the light beam 212 reflected from the wafer W.

In some embodiments, the process module 220 is configured to control the process of the wafer W. For example, the process module 220 is configured to send a signal to the data collection control unit 230 to trigger the operation of the optical reflectometer 210, i.e. collecting reflectance data.

In some embodiments, after the data collection is triggered, the processor 240 is configured to receive the data from the spectrometer in the optical reflectometer 210 and further configured to analyze the reflectance data. For illustration in FIG. 2, the processor 240 is configured to communicate with process module 220, the data collection control unit 230, and optical reflectometer 210. In some embodiments, the processor 240 is configured to check whether a data collection operation performed by the optical reflectometer 210 is completed. When the data collection operation is completed, the processor 240 sends an endpoint signal to the process module 220 to inform the process module 220 of stopping sending the signal to the data collection control unit 230. When the data collection operation is not completed, the processor 240 informs the data collection control unit 230 of keeping control the optical reflectometer 210 to collect reflectance data.

In some embodiments, when a metal film of the wafer has a residual portion after being etched by the process chamber 140 of FIG. 1, the optical reflectometer 210 identifies a reflectance change accordingly (which will be discussed in more details below), the processor 240 is configured to generate an activation signal when receiving data associated with the reflectance change, from the optical reflectometer 210, in which the reflectance change indicates the condition that the metal film of the wafer has the residual portion after being etched by the process chamber 140.

In some embodiments, the processor 240 includes a model for calculating reflectance and non-linear regression routine. The model is configured for calculating reflectance of the wafer W with respect to the corresponding wavelength. The non-linear regression routine is configured to search an optimal match between the modeled reflectance and the reflectance data obtained from the optical reflectometer 210. The regression routine described above is given for explanation purposes. Various regression methods are within the contemplated scope of the present disclosure. For example, in some other embodiments, multi-variate regression analysis and neural net matching are used to search the optimal match between the modeled reflectance and the reflectance data obtained from the optical reflectometer 210.

The above configurations of the devices in the measuring system 200 are given for illustrative purposes. Various configurations of the devices in the measuring system 200 are within the contemplated scope of the present disclosure. For example, in various embodiments, when the optical reflectometer 210 is equipped in the factory interface 110, the load lock chambers 120, the buffer chamber 130, or the combination thereof, as illustrated above, the process module 220, the data collection control unit 230, the processor 240, or the combination thereof is also equipped in the factory interface 110, the load lock chambers 120, the buffer chamber 130, or the combination thereof.

Figure 3:
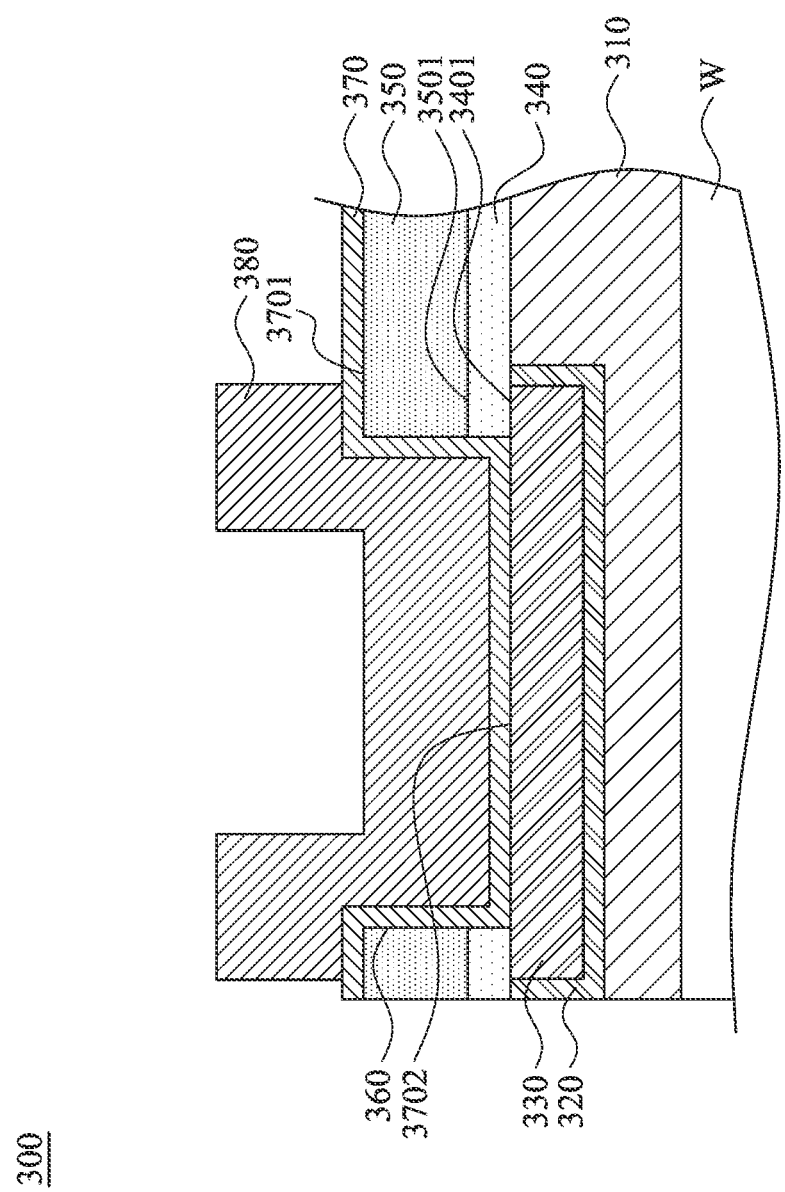
FIG. 3 is a cross section view of the wafer W with the pattern and/or structure disposed thereon, according to some embodiments of the present disclosure.

Reference is made to FIG. 3. FIG. 3 is a cross section view of the wafer with the pattern and/or structure 300 disposed thereon, according to some embodiments of the present disclosure.

For illustration in FIG. 3, the pattern and/or structure 300 includes a copper (Cu) buried layer 330 formed in an insulating film 310 on the wafer W. In some embodiments, the pattern and/or structure 300 includes a tantalum nitride (TaN) liner film 320 interposing between the Cu buried layer 330 and the insulating film 310. In some embodiments, the material of the Cu buried layer 330 is an alloy, for example, CuAl or other conductive materials. The material of layer 330 is given for explanation purposes. Various materials are within the contemplated scope of the present disclosure.

In some embodiments, the pattern and/or structure 300 further includes a silicon nitride (SiN) film 340 formed on the Cu buried layer 330 and a silicon dioxide ($SiO_2$) film 350 disposed on the SiN film 340. In some embodiments, the $SiO_2$ film 350 is configured for forming an opening 360 in the pattern and/or structure 300. In some embodiments, material of the film 350 is not limited to $SiO_2$, other open cut materials are within the contemplated of the present disclosure. For illustration in FIG. 3, the bottom of the opening 360 is the top surface of the Cu buried layer 330. In some embodiments, the opening 360 is formed under an etching process, such as RIE process or other plasma related etching processes. The etching process is configured to etch the $SiO_2$ film 350 and the SiN film 340 in order to form the opening 360.

In some embodiments, the pattern and/or structure 300 includes a tantalum (Ta) film 370 formed on the opening 360. For illustration in FIG. 3, the Ta film 370 is contacted with the top surface and the sidewalls of the $SiO_2$ film 350, and is contacted with the sidewalls of the SiN film 340, and is contacted with the top surface of the Cu buried layer 330.

In some embodiments, the pattern and/or structure 300 further includes an aluminum (Al) film 380 formed on the Ta film 370 and filling the opening 360. For illustration in FIG. 3, the Ta film 370 and the Al film 380 form a heterostructure which includes Al and Ta. The materials of the heterostructure are given for explanation purposes. Various materials of film 370 and 380 are within the contemplated scope of the present disclosure. For example the film 370 and 380 are formed by other metals or alloys thereof.

Figure 4:
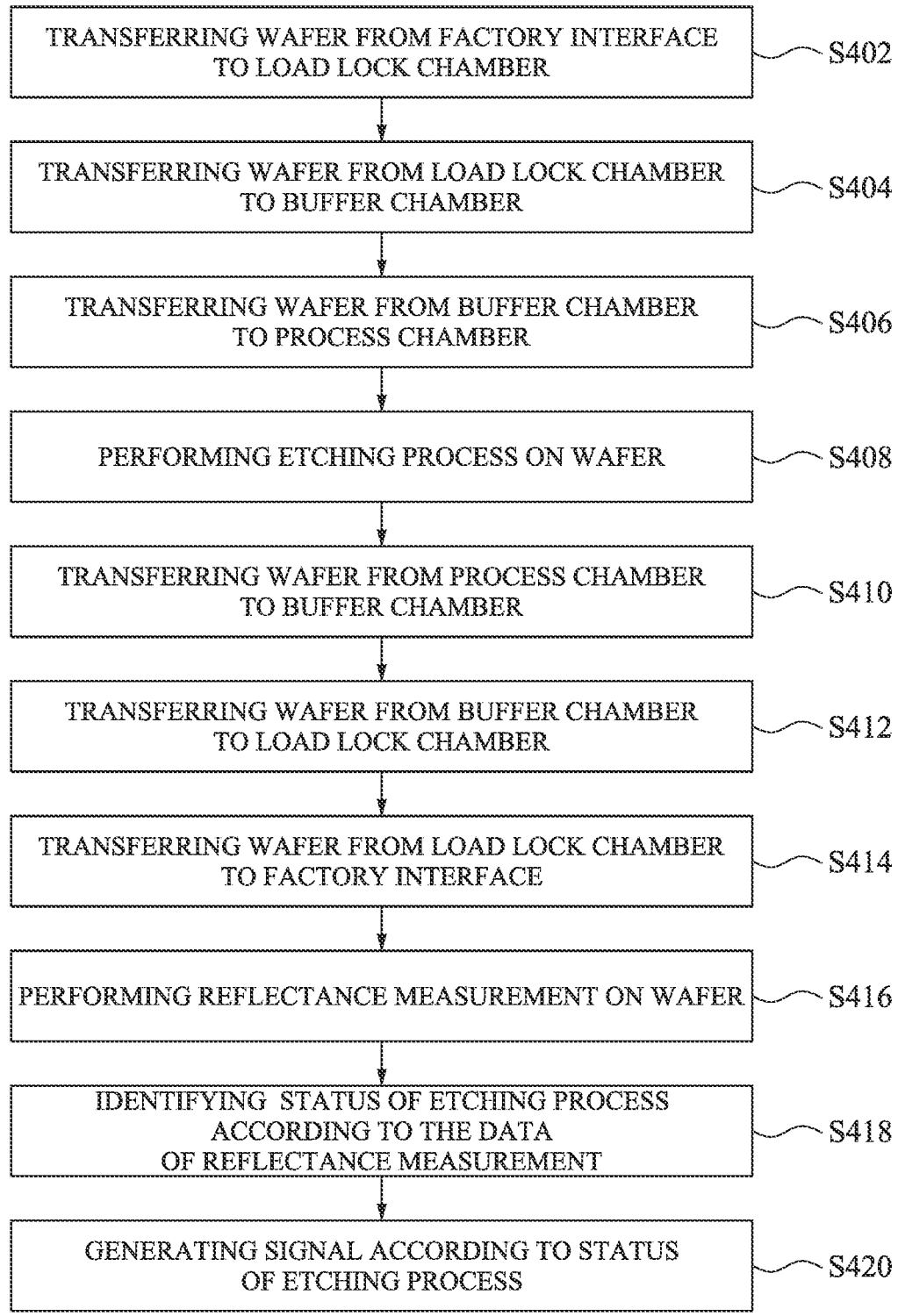
FIG. 4 a flow chart of a method for measuring the optical reflectance, according to some embodiments of the present disclosure.

Reference is made to FIG. 4. FIG. 4 is a flow chart of a method 400 for measuring the optical reflectance, according to some embodiments of the present disclosure. The method 400 includes operations S402-S420. The operations S402-S420 will be discussed with reference to FIGS. 1-3 below.

In operation S402, with reference to FIG. 1, the wafer in the factory interface 110 is transferred by the robot in the factory interface 110 to one of the load lock chambers 120 through the valve V1. For convenience of illustration, the load lock chamber 120 as discussed below in the method 400 is referred to as the upper load lock chamber 120 shown in FIG. 1, or the lower load lock chamber 120 shown in FIG. 1. Before transferring the wafer, the wafer is loaded in the factory interface 110 under the first environment. In some embodiments, the first environment is under atmosphere and room temperature. Then the valve V1 between the load lock chamber 120 and the factory interface 110 is open. The environment in the factory interface 110 and the load lock chamber 120 are equalized. In some embodiments, before the valve V1 is open, a ventilation process is performed on the load lock chamber 120 to make the environment in the load lock chamber 120 similar to the first environment. Then, after the valve V1 is open, the environment in the factory interface 110 and the load lock chamber 120 are equalized, the wafer is transferred from the factory interface 110 to the load lock chamber 120. For illustration in FIG. 1, the wafer is transferred to position B or C in the load lock chamber 120. After the wafer is transferred to the load lock chamber 120, the valve V1 is closed in order to isolate the environment between the load lock chamber 120 and the factory interface 110.

In operation S404, with reference to FIG. 1, the wafer is transferred from the load lock chamber 120 to the buffer chamber 130 through the valve V2 and is received by the robot blade 132 of the robot 131 of the buffer chamber 130. Before transferring the wafer, the valve V1-V2 are closed, and the environment in the load lock chamber 120 is kept in the first environment. In some embodiments, before the valve V2 is open, a vacuum process is performed on the load lock chamber 120 to make the environment in the load lock chamber 120 similar to the environment in the buffer chamber 130 (i.e., the second environment). Then, after the valve V2 is open, the environment in the load lock chamber 120 and the buffer chamber 130 are equalized, the wafer is transferred from the load lock chamber 120 to the buffer chamber 130. For illustration in FIG. 1, the wafer is transferred from the position B or C in the load lock chamber 120 to the position D or the position E by the robot blade 132 of the robot 131 of the buffer chamber 130. After the wafer is transferred to the buffer chamber 130, the valve V2 is closed in order to isolate the environment between the load lock chamber 120 and the buffer chamber 130.

Generally speaking, the pressure in the second environment is lower than the pressure in the first environment. Reference is made again to FIG. 2. The multi-chamber system 100 further includes valves (not shown in FIG. 1) coupled between the buffer chamber 130 and the process chambers 140, respectively. When one of the valves is open, the corresponding process chamber 140 and the buffer chamber 130 are in spatial communication with each other, and the environment in the corresponding process chamber 140 is equalized with the environment (e.g., the second environment) in the buffer chamber 130 to have a lower pressure than the pressure in the first environment. In some embodiments, the buffer chamber 130 and process chambers 140 are constantly kept in the second environment in order to avoid particles or other contamination from the outside environment. In some embodiments, the second environment is suitable for plasma generation. In some embodiments, the second environment is suitable for CVD and PVD processes.

In operation S406, with reference to FIG. 1, the wafer in the buffer chamber 130 is transferred to one of the process chambers 140 by the robot blade 132 of the robot 131 of the buffer chamber 130. For illustration in FIG. 1, the wafer is transferred from the position D or position E to the process chamber 140. In some embodiments, before the wafer is transferred, a vacuum process is performed on the buffer chamber 130 in order to compensate the pressure change during the valve V2 is open. In some other embodiments, the vacuum process on the buffer chamber 130 is constantly performed in order to avoid contamination and save process time.

In operation S408, with reference to FIG. 3, the etching process is performed on the wafer W in the process chamber 140. In some embodiments, the etching process is configured to etch metal on the wafer W. In some other embodiments, the etching process is configured to etch alloy on the wafer W. In alternatively embodiments, the etching process is configured to etch insulator on the wafer W. The materials the etching process etched are given for the explanation purposes. Various materials which are etched by the etching process are within the contemplated scope of the present disclosure.

For illustration in FIG. 3, when the etching process is configured to etch insulator, such as $SiO_2$ film 350 and SiN film 340, the etching process will cease to etch when the material beneath the insulator is exposed. In some embodiments, the material beneath the etched insulator is metal, for example, Cu. In some other embodiments, the material beneath the etched insulator is another insulator different from the etched insulator, for example, SiN and insulating film 310.

For illustration in FIG. 3, when the etching process is configured to etch metal, such as Cu buried layer 330, Ta film 370, and Al film 380, the etching process will cease to etch when the material beneath the metal is exposed. In some embodiments, the material beneath the etched metal is another metal different the etched metal, for example, Ta and Cu. In some other embodiments, the material beneath the etched metal is insulator, for example, $SiO_2$.

In operation S410, with reference to FIG. 1, the wafer in the process chamber 140 is transferred to the buffer chamber 130 after the etching process is done. For illustration in FIG. 1, the wafer is transferred from the process chamber 140 to the position D or position E by the robot blade 132 of the robot 131 of the buffer chamber 130.

In operation S412, with reference to FIG. 1, the wafer in the buffer chamber 130 is transferred to the load lock chamber 120 through the valve V2 by the robot blade 132 of the robot 131 of the buffer chamber 130. Before transferring the wafer, the valves V1-V2 are closed, and the environment in the load lock chamber 120 is kept in the second environment since the valves V1-V2 are kept closed after the operation S404. Then, after the valve V2 is open, the wafer is transferred from the buffer chamber 130 to the load lock chamber 120. For illustration in FIG. 1, the wafer is transferred from the position D or the position E in the buffer chamber 130 to the position B by the robot blade 132 of the robot 131 of the buffer chamber 130 through the valve V2. After the wafer is transferred to the load lock chamber 120, the valve V2 is closed in order to isolate the environment between the load lock chamber 120 and the buffer chamber 130.

In operation S414, with reference to FIG. 1, the wafer in the load lock chamber 120 is transferred to the factory interface 110 by the robot in the factory interface 110 through the valve V1. Before transferring the wafer, the valves V1-V2 are closed. In some embodiments, before the valve V1 is open, a ventilation process is performed on the load lock chamber 120 to make the environment in the load lock chamber 120 similar to the first environment in the factory interface 110. The ventilation process is performed to protect the load lock chamber 120 and the factory interface 110 from the damage due to the sudden pressure change between the first environment and the second environment during the valve V1 is opening. Alternatively stated, the ventilation process is performed to protect the vacuum pump in the load lock chamber 120 from the immediate pressure change. Then, after the valve V1 is open, the environment in the load lock chamber 120 and the factory interface 110 are equalized, the wafer is transferred from the load lock chamber 120 to the factory interface 110. For illustration in FIG. 1, the wafer is transferred to the position A in the factory interface 110 from the position B in the load lock chamber 120 by the robot of the factory interface 110.

In operation S416, with reference to FIG. 1, the reflectance measurement is performed on the wafer. For illustration in FIG. 1, the reflectance measurement is performed in the position A in the factory interface 110 after the wafer is transferred from the load lock chamber 120. The position for performing the reflectance measurement in method 400 is given for illustrative purposes. Various positions for performing the reflectance measurement are within the contemplated scope of the present disclosure. For example, in some embodiments, the reflectance measure is able to be performed in the position B or C in the load lock chambers 120 after the wafer in transferred from the buffer chamber 130. In some other embodiments, the reflectance measure is able to be performed in the position D or E in the buffer chamber 130 after the wafer in transferred from the process chamber 140. Alternatively stated, the operation S416 is able to be performed between the operation S410 and the operation S412, and between the operation S412 and the operation S414.

Further detail of the operation S416 is described below with reference to FIGS. 2-3. In operation S416, the process module 220 send a signal to the data collection control unit 230 to trigger the optical reflectometer 210. After the optical reflectometer 210 is triggered, the light source in the optical reflectometer 210 generates the normal incident light beam 211 toward the wafer W. In some embodiments, the light beam 211 has multi-wavelength. The system of optical element in the optical reflectometer 210 focuses the light beam 211 on the target material of the pattern and/or structure 300 on the wafer W. The spectrometer in the optical reflectometer 210 receives and detects the reflected light beam 212 from the wafer W. The spectrometer in the optical reflectometer 210 further analyzes the received light beam 212 and sends the analyzing result to the processor 240. In some embodiments, the processor 240, the data collection control unit 230, and the process module 220 communicate with one another for controlling the optical reflectometer 210 to perform the above analyzing operation to the target material of the pattern and/or structure 300 on the wafer W.

In some embodiments, the operation S416 is able to measure the reflectance when the etching process is configured to etch an insulator. For example, for illustration in FIG. 3, when the etching process is configured to etch SiN film 340 in the location 3401, the etching process will cease when the Cu buried layer 330 is exposed. The reflectance measure is performed on the Cu buried layer 330 at the location 3401. If the SiN film 340 is not entirely removed and a part of the SiN film 340 still remains on the location 3401, the measured reflectance includes the reflectance of SiN. Thus, the measured result deviates from a pre-determined value (e.g., the reflectance of Cu). Since the reflectance of Cu and SiN are different from each other, the optical reflectometer 210 is able to identify whether the measured material is Cu by receiving and analyzing the reflected light beam 212 as discussed above. When a residual portion of the SiN film 340 exists, the optical reflectometer 210 transmits data associated with a reflectance change to the processor 240. When receiving the data associated with the reflectance change, the processor 240 is able to further generate an activation signal representing the corresponding condition. Alternatively stated, when the SiN film 340 is not etched completely, the optical reflectometer 210 identifies a reflectance change due to different materials which are measured, and the processor 240 generates an activation signal accordingly for notification. Based on the notification including, for example, the activation signal as discussed above, the status of the etching process is defined as FAIL. On the other hand, when the SiN film 340 is etched completely, the measured result generated from the optical reflectometer 210 may have the pre-determined value (e.g., the reflectance of Cu), meaning that the reflectance change is zero, and the processor 240 operate normally when receiving the data from the optical reflectometer 210. In this circumstance, the status of the etching process is defined as PASS.

For another example, for illustration in FIG. 3, when the etching process is configured to etch the $SiO_2$ film 350 in the location 3501, the etching process will cease when the SiN film 340 is exposed. The reflectance measure is performed on the SiN film 340 at the location 3501. In a similar way, according to the reflectance change, the optical reflectometer 210 is able to identify whether the measured material is SiN and to generate the corresponding activation signal.

In alternative embodiments, the operation S416 is able to measure the reflectance when the etching process is configured to etch a metal. For example, for illustration in FIG. 3, when the etching process is configured to etch Ta film 370 in the location 3701, the etching process will cease when the $SiO_2$ film 350 is exposed. The reflectance measure is performed on the $SiO_2$ film 350 at the location 3701. If the Ta film 370 is not entirely removed and a part of the Ta film 370 still remains on the location 3701, the measured reflectance includes the reflectance of Ta. Thus, the measured result deviates from a pre-determined value (e.g., the reflectance of $SiO_2$). Since the reflectance of Ta and $SiO_2$ are different from each other, the optical reflectometer 210 is able to identify whether the measured material is $SiO_2$ by receiving and analyzing the reflected light beam 212 as discussed above. When a residual portion of the Ta film 370 exists, the optical reflectometer 210 transmits data associated with a reflectance change to the processor 240. When receiving the data associated with the reflectance change, the processor 240 is able to further generate an activation signal representing the corresponding condition. Alternatively stated, when the Ta film 370 is not etched completely, the optical reflectometer 210 identifies a reflectance change due to different materials which are measured, and the processor 240 generates an activation signal accordingly for notification. Based on the notification including, for example, the activation signal as discussed above, the status of the etching process is defined as FAIL. On the other hand, when the Ta film 370 is etched completely, the measured result generated from the optical reflectometer 210 may have the pre-determined value (e.g., the reflectance of $SiO_2$), and the processor 240 operate normally. In this circumstance, the status of the etching process is defined as PASS.

For another example, for illustration in FIG. 3, when the etching process is configured to etch Ta film 370 in the location 3702, the etching process will cease when the Cu buried layer 330 is exposed. The reflectance measure is performed on the Cu buried layer 330 at the location 3702. In a similar way, according to the reflectance change, the optical reflectometer 210 is able to identify whether the measured material is Cu and to generate the corresponding activation signal.

In operation S418, with reference to FIG. 2, the processor 240 identifies a status of the etching process according to the data of the reflectance measurement. After receiving the data from the optical reflectometer 210 and the data collection control unit 230, the model in the processor 240 calculates the reflectance of the wafer W with respect to the corresponding wavelength. Then, the non-linear regression routine in the processor 240 searches the optimal match between the modeled reflectance and the reflectance data obtained from the optical reflectometer 210.

When the etching process is performed completely, the etched material no longer exists at the location where the etching process is performed, and the reflectance is measured based on the material exposed after the etching process. The processor 240 is able to identify the etching process is performed successfully. In this circumstance, the status of the etching process is identified as PASS as discussed above. When the status is identified as PASS, a corresponding process is to be performed to the wafer W in some embodiments. In some embodiments, the corresponding process is a deposition process. In some other embodiments, the corresponding process is an etching process. In alternative embodiments, the corresponding process is a CMP (chemical-mechanical planarization) process. The processes stated above are given for illustrative purposes. Various processes are within the contemplated scope of the present disclosure.

When the etching process is not performed completely, which means the etched material has residual at the location where the etching process is performed, and the reflectance is measured based on the etched material. The processor 240 is able to identify whether the etching process is performed incompletely. In this circumstance, the status of the etching process is identified as FAIL as discussed above. When the status is identified as FAIL, the wafer is removed from the process flow, and the multi-chamber system 100 is notified to be inspected in some embodiments.

In some embodiments, the measuring system 200 is able to distinguish the materials based on the wavelength and the reflectance of the light beam. Each bandwidth of the wavelength of the light beam has a specific reflectance corresponding to the material which the light beam reflects from. According to the reflectance, the measuring system 200 distinguishes the material disposed on the location after the etching process ceases, and the measuring system 200 further identifies the status of the etching process as PASS or FAIL.

In some embodiments, the light beam is multi-wavelength, and the measuring system 200 distinguishes the material based on different wavelength, therefore, the sensitivity and the accuracy of the measure increases.

In operation S420, the measuring system 200 generates a signal according to the status of the etching process. The signal is configured for informing the user or the control system of the status of the etching process.

In some approaches, when the reflectance measurement is not performed after the etching process, the status of the etching process is not able to be known immediately. Accordingly, if the etching process is failed in a batch of wafers, this batch of wafers wastes time and resource to perform the following processes until the test or measurement is done. Alternatively stated, off-line measurement tends to waste time and resource when the status of an etching process is FAIL.

Compared to the above approaches, in the embodiments of the present disclosure, the reflectance measurement is performed after the etching process. The status of the etching process is able to be known immediately after the etching process is finished. Alternatively stated, the reflectance measurement is a real-time measurement. It provides a real-time monitor to the etching process. Moreover, the multi-wavelength light source also provides higher accuracy and sensitivity for the reflectance measurement. Accordingly, the waste of time and the resource of the processes for the bad wafers are able to be prevented.

The above illustrations include exemplary operations, but the operations are not necessarily performed in the order shown. Operations may be added, replaced, changed order, and/or eliminated as appropriate, in accordance with the spirit and scope of various embodiments of the present disclosure. For example, in various embodiments, in addition to the operation S416, after the reflectance measurement is performed, another measurement is performed at the same location, or the reflectance measure is performed at another locations.

Figure 5A:
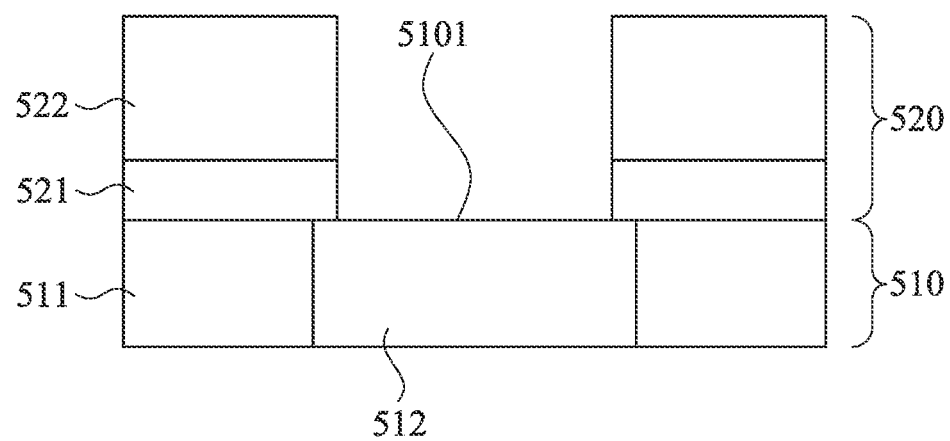
FIG. 5A is a cross section view of a semiconductor structure measured by the method illustrated in FIG. 4, according to some embodiments of the present disclosure.

Reference is made to FIG. 5A. FIG. 5A is a cross section view of a semiconductor structure 500A measured by the method 400 illustrated in FIG. 4, according to some embodiments of the present disclosure. For illustration in FIG. 5A, the semiconductor structure 500A includes a structure 510 and a structure 520 disposed above the structure 510. In some embodiments, the semiconductor structure 500A is implemented as a contact structure.

In some embodiments, the structure 510 includes a first un-doped silicon glass (USG) layer 511 and a Cu layer 512. In some embodiments, the structure 520 includes a first SiN layer 521 and a second USG layer 522. In some embodiments, the structure 510 is configured as a top metal layer in the contact structure. In some embodiments, the structure 520 is configured as a first passivation layer.

In some embodiments, the semiconductor structure 500A is formed by the following processes, in which at least a part of method 400 is included. The first USG layer 511 is formed on a substrate (not shown) by a CVD process. A first photolithography is performed to define a pattern for depositing the copper (Cu). A first dry etching process is then performed to form the pattern for depositing the copper. Copper is deposited in the defined pattern by a PVD process. A CMP process is then performed to remove the excessive copper in order to form the Cu layer 512, as illustrated in FIG. 5A. Next, the first SiN layer 521 is formed over the structure 510 by a CVD process, and the second USG layer 522 is formed above the first SiN layer 521 by a CVD process. Then, a second photolithography is performed to define a passivation pattern for forming a contact. A second dry etching process is performed to form the passivation pattern. The dry etching process is then performed until the Cu layer 512 is exposed as illustrated in FIG. 5A. After the dry etching process is performed, the Cu layer 512 is supposed to be exposed, and the operation 416 of method 400 is performed to determine whether the Cu layer 512 is already exposed. For illustration, the reflectance measurement in operation 416 is performed to a location 5101 to determine whether the Cu layer 512 is already exposed. Alternatively stated, the operation 416 of the method 400 is performed to determine whether the dry etching process is PASS or FAIL.

Figure 5B:
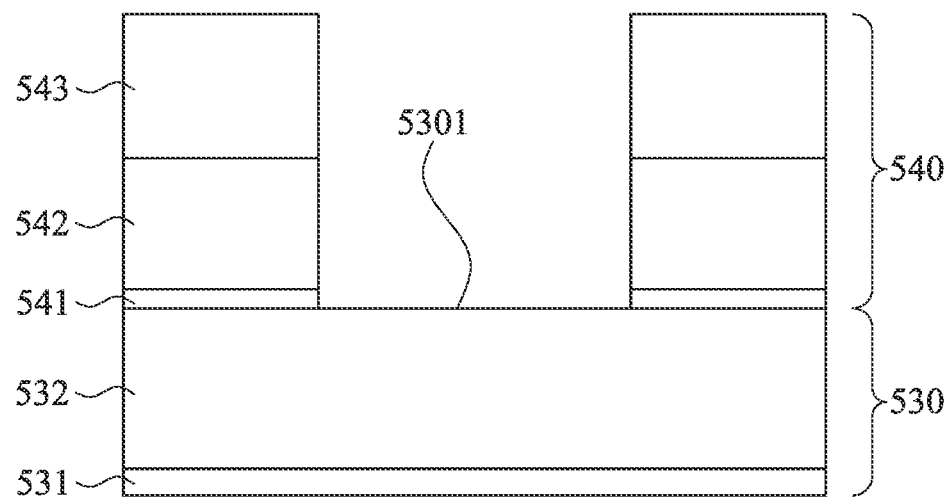
FIG. 5B is a cross section view of a semiconductor structure measured by the method illustrated in FIG. 4, according to some other embodiments of the present disclosure.

Reference is made to FIG. 5B. FIG. 5B is a cross section view of a semiconductor structure 500B measured by the method 400 illustrated in FIG. 4, according to some other embodiments of the present disclosure. For illustration in FIG. 5B, the semiconductor structure 500B includes a structure 530 and a structure 540 disposed above the structure 530. In some embodiments, the semiconductor structure 500B is implemented as a contact structure.

In some embodiments, the structure 530 includes a tantalum nitride (TaN) layer 531 and a pad layer 532. In some embodiments, the pad layer 532 includes Cu, Al, or the combination thereof. In some embodiments, the structure 540 includes a silicon oxynitride (SiON) layer 541, a third USG layer 542, and a second SiN layer 543. In some embodiments, the structure 530 is configured as an aluminum cupper pad layer in the contact structure. In some embodiments, the structure 540 is configured as a second passivation layer.

In some embodiments, the semiconductor structure 500B is formed by the following processes, in which at least a part of method 400 is included. The TaN layer 531 is formed on a substrate (not shown) by a PVD process. The pad layer 532 is formed above the TaN layer 531 by a PVD process. The SiON layer 541 is formed above the structure 530 by a CVD process. The third USG layer 542 is formed above the SiON layer 541 by a CVD process. The second SiN layer 543 is formed above the third USG layer 542 by a CVD process. A photolithography is performed to define a passivation pattern for exposing the pad layer 532. A dry etching process is performed to form the passivation pattern. The dry etching process is performed until the pad layer 532 is exposed as illustrated in FIG. 5B. After the dry etching process is performed, the pad layer 532 is supposed to be exposed, and the operation 416 of method 400 is performed to determine whether the pad layer 532 is already exposed. For illustration, the reflectance measurement in operation 416 is performed to a location 5301 to determine whether the pad layer 532 is already exposed. Alternatively stated, the operation 416 of the method 400 is performed to determine whether the dry etching process is PASS or FAIL.

Figure 5C:
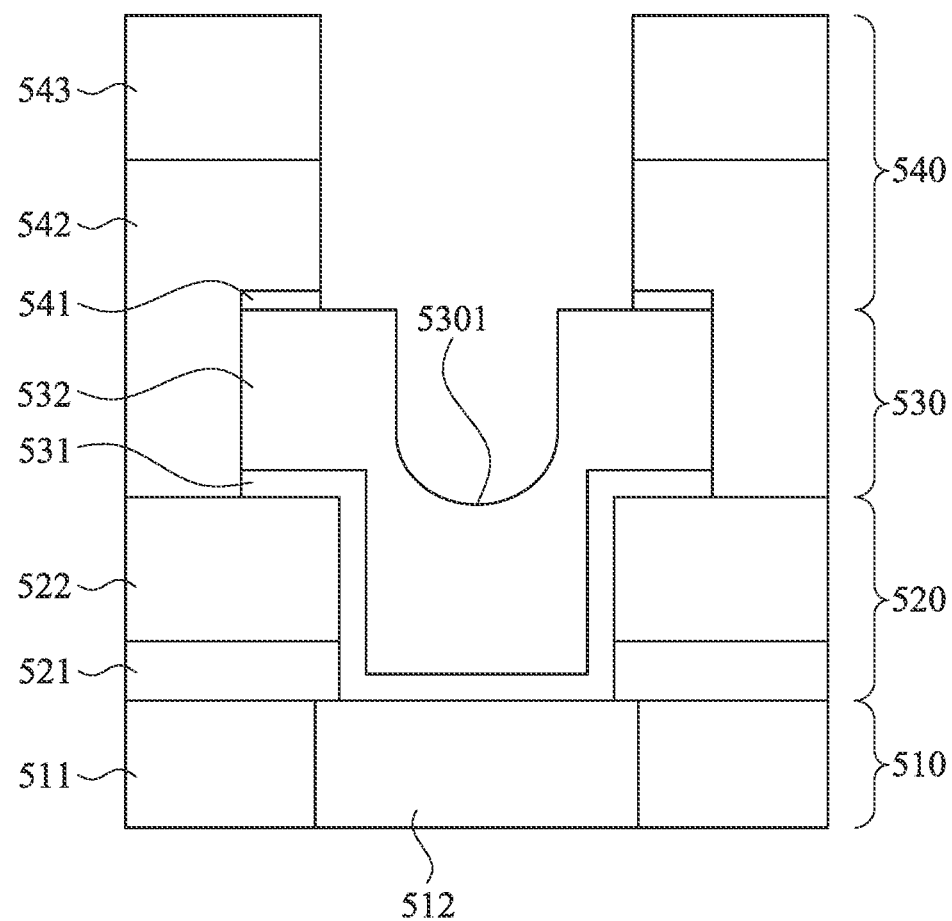
FIG. 5C is a cross section view of a semiconductor structure measured by the method illustrated in FIG. 4, according to various embodiments of the present disclosure.

Reference is made to FIG. 5C. FIG. 5C is a cross section view of a semiconductor structure 500C measured by the method 400 illustrated in FIG. 4, according to various embodiments of the present disclosure. With respect to the embodiments of FIGS. 5A and 5B, like elements in FIG. 5C are designated with the same reference numbers for ease of understanding.

For illustration in FIG. 5C, the semiconductor structure 500C includes a structure 510, a structure 520 disposed above the structure 510, a structure 530 disposed above the structure 520, and a structure 540 disposed above the structure 530. In some embodiments, the semiconductor structure 500C is implemented as a contact structure.

In some embodiments, the structure 510 and the structure 520 include the same structures as the semiconductor structure 500A illustrated in FIG. 5A. In some embodiments, compared to FIG. 5A, the structure 520 further includes the TaN layer 531 and the pad layer 532 as illustrated in FIG. 5C. In some embodiments, the structure 530 includes the TaN layer 531, the pad layer 532, and the third USG layer 542. In some embodiments, the structure 540 includes the SiON layer 541, the third USG layer 542, and the second SiN layer 543.

In some embodiments, the semiconductor structure 500C is formed by the following processes, in which at least a part of method 400 is included. The structure 510 is formed by the same process as forming the structure 510 in FIG. 5A.

The first SiN layer 521 is formed on structure 510 by a CVD process, and the second USG layer 522 is formed above the first SiN layer 521 by a CVD process. Then, a photolithography process is performed to define a first pattern. A dry etching process is performed to form the first pattern. After the dry etching process is performed, the Cu layer 512 is exposed. The TaN layer 531 is then formed on the second USD layer 522 and the exposed Cu layer 512 by a PVD process. The pad layer 532 is formed above the TaN layer 531. The SiON layer 541 is formed above the pad layer 532. For illustration in FIG. 5C, the TaN layer 531, the pad layer 532, and the SiON layer 541 have a concave shape in the cross section view. A photolithography process is performed to define a second pattern. A dry etching process is performed to form the second pattern. After the second pattern is formed, the second USG layer 522 is exposed. The third USG layer 542 is deposited above the second USG layer 522 and the SiON layer 541. The second SiN 543 layer is deposited above the third USG layer 542. A photolithography process is performed to define a third pattern. The third pattern is configured for exposing the pad layer 532. A dry etching process is then performed to form the third pattern. After the dry etching process is performed, the pad layer 532 is supposed to be exposed, and the operation 416 of method 400 is performed to determine whether the pad layer 532 is already exposed. For illustration, the reflectance measure in operation 416 is performed to the location 5301 to determine whether the pad layer 532 is already exposed. Alternatively stated, the operation 416 of the method 400 is performed to determine whether the dry etching process is PASS or FAIL.

The above configurations and processes of embodiments in FIGS. 5A, 5B and 5C are provided for illustrative purposes. Various configurations and processes of the embodiments in FIGS. 5A, 5B and 5C are within the contemplated scope of the present disclosure.

Also disclosed is that a method includes: transferring a wafer from a factory interface through a load lock chamber to a buffer chamber; transferring the wafer from the buffer chamber to a process chamber; etching the wafer in the process chamber, to remove a material of the wafer; and after the wafer is etched, performing reflectance measurements to the wafer in the factory interface, the load lock chamber, the buffer chamber, or combination thereof, to identify if the material of the wafer is removed entirely according to a reflectance of the wafer.

Also disclosed is that a method includes: collecting reflectance data of a wafer by a reflectometer; identifying, according to the reflectance data, whether an etching process of the wafer is performed completely; when the etching process is performed completely, performing a corresponding process after the etching process in a process flow to the wafer; and when the etching process is not performed completely, removing the wafer from the process flow.

Also disclosed is that a method includes: transferring a wafer through a first valve of a load lock chamber to the load lock chamber; before the first valve is opened, performing a ventilation process on the load lock chamber to protect a vacuum pump; and vacuuming, by the vacuum pump, the load lock chamber before the first valve is closed and after the wafer is transferred to the load lock chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   transferring a wafer from a factory interface through a load lock chamber to a buffer chamber;
   transferring the wafer from the buffer chamber to a process chamber;
   etching the wafer in the process chamber, to remove a material of the wafer;
   after the wafer is etched, performing reflectance measurements to the wafer in the factory interface, the load lock chamber, the buffer chamber, or combination thereof, to identify if the material of the wafer is removed entirely according to a reflectance of the wafer;
   protecting a vacuum pump in the load lock chamber by performing a ventilation process on the load lock chamber;
   receiving the wafer by the load lock chamber from the factory interface when the load lock chamber has a first temperature;
   receiving the wafer by the load lock chamber from the buffer chamber when the load lock chamber has a second temperature higher than the first temperature;
   performing a first etching process to a first nitride film on the wafer;
   when a second nitride film below the first nitride film is exposed, ceasing the first etching process;
   performing a second etching process to the second nitride film on the wafer; and
   when a buried copper layer below the second nitride film is exposed, ceasing the second etching process.

2. The method of claim 1, further comprising:
   identifying the material of the wafer if the material is not removed entirely.

3. The method of claim 1, further comprising:
   identifying an exposed material underneath the material of the wafer if the material is removed entirely.

4. The method of claim 1, wherein performing reflectance measurements to the wafer comprises:
   performing the reflectance measurements to the wafer at a robot blade of a robot that is configured in the buffer chamber.

5. The method of claim 1, wherein performing reflectance measurements to the wafer comprises:
   irradiating the wafer with a measuring light to measure a reflectance obtained from the wafer depending on a wavelength of the measuring light; and
   generating data associated with a reflectance change indicating whether a target material of the wafer is entirely removed by the process chamber.

6. The method of claim 1, wherein performing reflectance measurements to the wafer comprises:
   irradiating the wafer with a measuring light that has various wavelengths different from each other, for determining whether the wafer has a required material after being processed by the process chamber.

7. The method of claim 1, wherein performing reflectance measurements to the wafer comprises:
   irradiating an exposed material of the wafer with a measuring light that has various wavelengths different from each other, to obtain a reflectance change for determining whether the exposed material of the wafer is an expected material.

8. A method, comprising:
collecting reflectance data of a wafer by a reflectometer;
identifying, according to the reflectance data, whether an etching process of the wafer is performed completely;
when the etching process is performed completely, performing a corresponding process after the etching process in a process flow to the wafer;
when the etching process is not performed completely, removing the wafer from the process flow;
when the wafer is transferred from a buffer chamber to a process chamber, performing a vacuum process on the buffer chamber constantly and keeping each of a first valve and a second valve of a load lock chamber closed, wherein the first valve and the second valve are at two sides of the load lock chamber, respectively; and
using neural net matching to search an optimal match between a modeled reflectance and the reflectance data to identify whether the etching process is performed completely to remove the wafer from the process flow.

9. The method of claim 8, further comprising:
receiving the wafer from the load lock chamber by a robot blade in the buffer chamber; and
before the robot blade receives the wafer, closing the first valve of the load lock chamber.

10. The method of claim 9, further comprising:
before the first valve is closed and after the wafer is transferred to the load lock chamber, vacuuming the load lock chamber by a vacuum pump.

11. The method of claim 10, further comprising:
before the first valve is opened, performing a ventilation process on the load lock chamber to protect the vacuum pump.

12. The method of claim 9, further comprising:
etching the wafer in the process chamber,
wherein the second valve is adjacent to the buffer chamber.

13. The method of claim 12, further comprising:
after the wafer is etched in the process chamber and is transferred to the load lock chamber, and before the first valve is opened, performing a ventilation process on the load lock chamber; and
after the ventilation process is performed, transferring the wafer from the load lock chamber through the first valve.

14. The method of claim 8, wherein there is no other process performed between the etching process and collecting the reflectance data except transferring the wafer.

15. A method, comprising:
transferring a wafer through a first valve of a load lock chamber to the load lock chamber;
before the first valve is opened, performing a ventilation process on the load lock chamber to protect a vacuum pump in the load lock chamber;
vacuuming, by the vacuum pump, the load lock chamber before the first valve is closed and after the wafer is transferred to the load lock chamber;
in a period from the wafer being transferred from the load lock chamber to a buffer chamber until the wafer being transferred from the buffer chamber is back into the load lock chamber, keeping the first valve being closed; and
striking a light beam with a wavelength of 1000 nanometers to the wafer.

16. The method of claim 15, wherein vacuuming the load lock chamber comprises:
vacuuming the load lock chamber to about 200 m-torrs.

17. The method of claim 15, further comprising:
receiving the wafer from the load lock chamber by a robot blade in the buffer chamber; and
before the robot blade receives the wafer, closing the first valve.

18. The method of claim 15, further comprising:
when the wafer is transferred from the buffer chamber to a process chamber, performing a vacuum process on the buffer chamber constantly and keeping each of the first valve and a second valve of the load lock chamber closed; and
performing an etching process to the wafer in the process chamber,
wherein the second valve is adjacent to the buffer chamber.

19. The method of claim 18, further comprising:
when the etching process is performed completely, performing a corresponding process after the etching process in a process flow to the wafer, and
when the etching process is not performed completely, removing the wafer from the process flow.

20. The method of claim 18, further comprising:
after the wafer is etched in the process chamber and is transferred to the load lock chamber, and before the first valve is opened, performing the ventilation process; and
after the ventilation process is performed, transferring the wafer from the load lock chamber through the first valve.

* * * * *